EPITAXIAL PLANAR TRANSISTOR

Filed Dec. 26, 1967

COMPONENTS OF IMPURITY DISTRIBUTION

PRIOR ART EPITAXIAL PLANAR TRANSISTOR-SECTION

RESULTANT IMPURITY DISTRIBUTION

COMPONENTS OF IMPURITY DISTRIBUTION

IMPROVED EPITAXIAL PLANAR TRANSISTOR-SECTION

RESULTANT IMPURITY DISTRIBUTION

INVENTOR.
ROBERT L. LUCE

BY D R Bressman

ATTORNEY 3,506,891
Patented Apr. 14, 1970

3,506,891

EPITAXIAL PLANAR TRANSISTOR

Robert L. Luce, North Wales, Pa., assignor to Philco-Ford Corporation, Philadelphia, Pa., a corporation of Delaware Filed Dec. 26, 1967, Ser. No. 693,424
Int. Cl. H01l 11/00, 5/00, 7/36
U.S. Cl. 317—235 2 Claims

ABSTRACT OF THE DISCLOSURE

Planar transistor formed in wafer having sequentially grown epitaxial layers with lower layer doped for desired resistivity of collector region and upper layer, which has base and emitter regions diffused therein, made substantially intrinsic to reduce carrier compensation in base region.

This invention relates to epitaxial planar transistors. and particularly to a novel epitaxial planar transistor and method of fabrication thereof in which many of the limitations of prior art transistors are overcome so as to provide a transistor of greatly improved operating characteristics.

In the formation of typical prior art epitaxial planar transistors, a uniformly-doped epitaxial layer of semiconductive material is grown on a low resistivity substrate. Base and emitter regions are diffused into a surface portion of this layer; the rest of the layer then serves as a collector region. It has been noted that because this epitaxial layer is doped throughout according to the desired resistivity of the collector region, many limitations are inherent in the resultant transistor.

For one, since the base is diffused into a region which already contains a large number of opposite conductivity (collector) impurities, many of the base impurities will be compensated by the collector impurities. This lowers the punchthrough voltage of the base region and thereby limits the thinness to which the base can be formed while still having an adequate punchthrough voltage. Accordingly, the maximum frequency response of the transistor is thereby reduced. In addition, the presence of a large number of compensated and hence inactive base impurity carriers reduces the mobility of the uncompensated, active carriers, thereby providing a base region with high resistance and slow carrier transit times. This also limits the high frequency response of the transistor, as well as the current-carrying capacity thereof.

Another drawback of the prior art epitaxial planar transistor stems from the fact that the actual base-collector junction is formed a relatively large distance above the bottom of the base diffusion; this causes base impurities to be present in the part of the collector region under the base-collector junction. The resultant base-collector junction thereby has a relatively gradual transition region, which limits the maximum current density which the base region can accommodate before the location of the base-collector junction is modified to a prohibitive extent.

Other limitations of the prior art epitaxial planar transistor which stem from the fact that the entire epitaxial layer is doped according to the resistivity of the collector region are (1) the difficulty of making an accurate base diffusion, and (2) a relatively long time to recover from a saturated condition. Accurate base diffusion is difficult because the base impurity diffuses into a uniformly-doped epitaxial layer; the base-collector junction thereby will be located where the base dopant concentration begins to exceed the existing concentration in the epitaxial layer. It would be desirable if the location of the base-collector junction could be determined relatively independently of the base diffusion dopant gradient, since this gradient is dependent on several highly variable base diffusion parameters. The relatively long time required for the prior art planar epitaxial transistor to recover from a saturated condition stems from the fact that minority carriers injected from the base into the collector will diffuse relatively far into the collector when the transistor is driven to saturation, thereby making it difficult to sweep these carriers out when the transistor is turned off. It would be desirable if carriers injected into the collector could be kept close to the base-collector junction so that these carriers could be swept out of the collector faster when the transistor is turned off.

Accordingly, several objects of the present invention are: (1) to provide a transistor in which the base region has a higher punchthrough voltage or can be made thinner with the same punchthrough voltage, (2) to provide a transistor in which the base region has reduced resistance and faster transit time, (3) to provide a transistor in which higher current densities can be accommodated in the base region, (4) to provide a structure in which it is easier to diffuse the base region accurately, and (5) to provide a transistor which can recover from a saturated condition in reduced time. Other objects and advantages of the present invention will become apparent from a consideration of the ensuing description thereof.

SUMMARY

According to the present invention an improved epitaxial planar transistor is formed by growing sequentially two epitaxial layers on a low resistivity substrate: the bottom layer, i.e., the layer closer to the substrate, having the resistivity desired for the collector region, and the upper layer being substantially intrinsic. A base region is diffused into the upper intrinsic layer so that the base-collector junction closely coincides with the boundary between the epitaxial layers, and an emitter region is diffused into the base region. The resulting structure is contacted and packaged conventionally.

DRAWINGS

FIG. 1A.—PRIOR ART TRANSISTOR

Figure 1B:
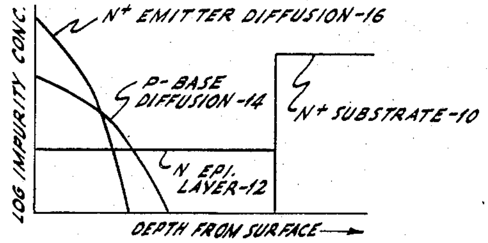
FIG. 1B shows the distribution of impurity components in said transistor.
Figure 1A:
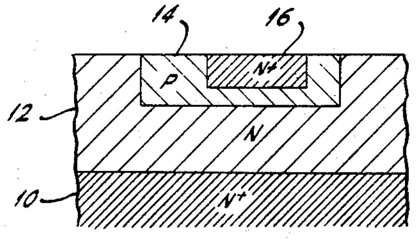
FIG. 1A shows a cross sectional view of a prior art epitaxial planar transistor.

A typical prior art epitaxial planar transistor, shown in cross sectional form in FIG. 1A (vertical dimensions exaggerated), comprises a low resistivity substrate 10 of $N^+$ type silicon on which is grown a higher resistivity epitaxial layer 12 of N type silicon. A medium resistivity P type base region 14 is diffused into the epitaxial layer and a low resistivity $N^+$ type emitter region 16 is diffused into base region 14. The transistor may be formed as a single unit or, as indicated by the irregular vertical edge lines thereof, can be part of a larger monolithic microcircuit. The surface configuration of the base and emitter regions 14 and 16 may be square, rectangular, or have any of the other shapes which are now well known to those skilled in the art. The $N^+$ substrate 10 is usually formed from a slice of $N^+$ material if the transistor is formed as a single unit, or, if the transistor is formed as part of a larger monolithic microcircuit, the $N^+$ substrate 10 may represent a high concentration surface diffusion in a higher resistivity wafer. One common way of contacting the transistor of FIG. 1A is by evaporating respective separate surface contacts over the base and emitter regions 14 and 16 and by evaporating a large area collector contact over a degeneratively-doped area of the surface of the epitaxial layer 12 which is separate from the base.

FIG. 1B is a plot of the distribution of impurity components along a vertical axis down the center of the transistor of FIG. 1A. The vertical scale represents the log of the impurity concentration and the horizontal scale represents distance down from the upper surface of the transistor.

The high horizontal line at the right of the plot represents the high concentration N+ substrate 10. Going left on the plot (and upwardly on the structure of FIG. 1A) is a low horizontal line which represents the lower concentration N type epitaxial layer 12. The straight vertical line to the right side of the plot represents the boundary between the substrate and the epitaxial layer 12, while the vertical line at the extreme left of the plot represents the upper surface of the epitaxial layer 12. The distribution of impurities from the P and N+ type base and emitter diffusions are shown by the respective indicated curved lines at the left of the plot. As is evident, both the base and emitter diffusions have their highest impurity concentration at the surface of the epitaxial layer and these conconetrations diminsh smoothly into the transistor, as is characteristic of the impurity diffusion process.

Figure 1C:
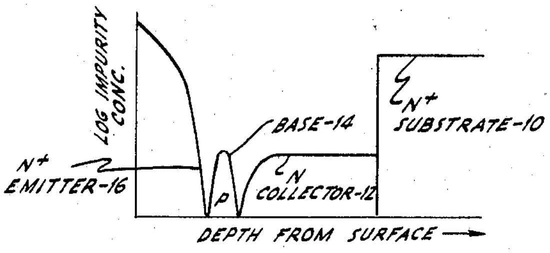
FIG. 1C shows the resultant impurity distribution in said transistor.

FIG. 1C represents the resultant or actual impurity distribution along a vertical axis down the center of the structure of FIG. 1A. The resultant curves of FIG. 1C are obtained by adding the distribution components indicated in FIG. 1B as follows: all of the N type distributions (substrate 10, epitaxial layer 12, and emitter 16) are added at all abscissa values while the P type curve (base diffusion 14) is subtracted at all of its abscissa values from the resultant of the N type values. Where a negative value is obtained it has been inverted so that the absolute values of impurity distribution are indicated. It should be noted that since FIGS. 1B and 1C are plotted on a logarithmic vertical scale, the ordinates of FIG. 1C are not the geometrical sum of the ordinates of FIG. 1B.

FIG. 1C indicates that the resultant impurity distribution, starting from the bottom of the wafer up, will comprise a high concentration level, representing the N+ substrate 10, followed by a lower concentration level, representing the N type collector 12. The concentration of collector 12 tapers gradually to zero at the base-collector junction. The net concentration of the base rises gradually to a peak and then diminishes to zero at the base-emitter junction. The net concentration of the emitter rises from the base-emitter junction to a given height and then rises more gradually up to the surface of the wafer.

The previously-discussed disadvantages and limitations of the structure of FIG. 1A are briefly reviewed here in order to set the stage for a better understanding of the structure of the invention. Since the base impurities are compensated by the collector impurities to a large extent, the base region will have a relatively low punchthrough voltage so that the actual base must be made relatively thick to have an adequate punchthrough voltage. The base has relatively high resistance and slow transit time because of the large number of compensated and hence inactive impurities therein. Since the collector region itself has many base impurities therein due to the fact that the bottom limit of the base diffusion is below the base-collector junction, the transition from collector to base is relatively gradual, which limits the maximum current the base can carry before the location of the base-collector junction will be modified to a prohibitive extent. The location of the base-collector junction is relatively hard to control accurately because it is dependent on the base dopant gradient, which in turn is controlled by several highly variable base diffusion parameters. The structure of FIG. 1A requires a relatively long time to recover from a saturated condition because the holes injected into the collector from the base diffuse relatively deeply into the collector and thereby require a relatively large time to be swept out when the transistor is turned off.

All of the above factors limit the maximum speed, performance, and current carrying capacity of the prior art epitaxial planar transistor. The present invention greatly improves or substantially eliminates all of these drawbacks.

FIG. 2.—IMPROVED TRANSISTOR

The improved transistor of the invention, illustrated in section in FIG. 2, includes a low resistivity N+ substrate 10, similar to that of the transistor of FIG. 1A. However the epitaxial portion of the transistor is grown in two layers, 18 and 20, in which the lower layer 18 has the same resistivity as layer 12 of the transistor of FIG. 1A, but wherein the upper layer 20 is made substantially intrinsic. The base 14 and emitter 16 are formed by sequentially diffusing P and N+ regions, respectively, into the substantially intrinsic epitaxial layer 20. The surface configurations of the base and emitter regions can be rectangular or any other suitable shape. The transistor is contacted and packaged in the usual fashion. A collector contact on the surface of intrinsic layer 20 away from the base will make a low-resistance connection with the collector region if the portion of the surface to which the contact is to be affixed has a degenerative (N+) region diffused therein, such as shown at 22. As with the transistor of FIG. 1, the structure is shown can be part of a larger monolithic microcircuit as indicated by the irregular vertical edge lines thereof or it can be fabricated as a single unit if desired.

Figure 2B:
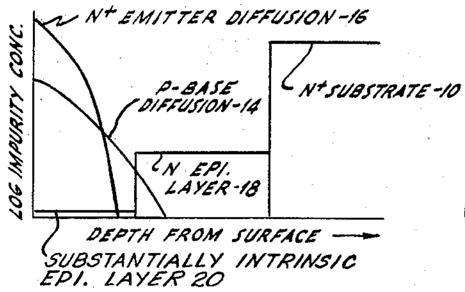
FIG. 2B shows the distribution of impurity components in said transistor.
Figure 2A:
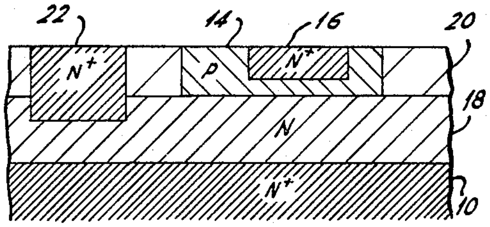
FIG. 2A shows in cross sectional form an improved epitaxial planar transistor according to the invention.

As indicated in FIG. 2B, the N type epitaxial layer 18 has substantially the same impurity concentration as layer 12 of the structure of FIG. 1A but it extends only about half way between the upper surface of region 10 and the surface of the wafer. The substantially intrinsic epitaxial layer 20 which is formed on top of layer 18 desirably is designed to have the lowest possible impurity concentration. Since it is impossible to remove all impurities, layer 20 is indicated as having a finite, rather than no impurity concentration. The P type base diffusion and the N+ type emitter diffusion are represented by the appropriately-labeled curved lines in FIG. 2B.

Figure 2C:
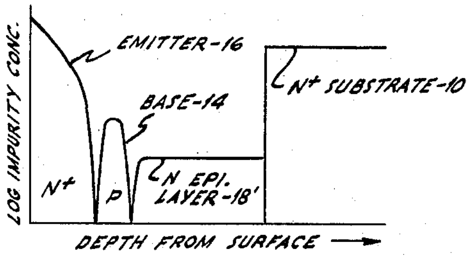
FIG. 2C shows the resultant impurity distribution in said transistor.

As indicated in FIG. 2C, the transition between the N type epitaxial layer 18 and the base region 14 is more abrupt than in the structure of FIG. 1A. Also the transition between emitter 16 and base 14 is more abrupt and the height of the resultant impurity distribution in the base 14 is greater in the transistor of the invention. This is because the compensation of P type impurities in the base by the N type collector impurities is greatly reduced or eliminated in the transistor of the invention due to the fact that the base region is diffused in an intrinsic epitaxial layer, rather than an epitaxial layer which is doped according to the collector concentration. Thus according to the invention a layer of the base region under the emitter contains substantially no N type impurities or at least far fewer N type impurities than any portion of the collector region.

The structure of the invention eliminates or greatly reduces all of the above noted disadvantages of the FIG. 1A structure. Since the structure of FIG. 2A has fewer collector impurities in the base region, the base region will have a higher punchthrough voltage or can be made thinner for the same punchthrough voltage. This increases the transistor's maximum operating speed and the permissible amplitude of the bias voltage which can be applied thereto. The absence of large numbers of collector impurity carriers in the base region also increases the mobility of the minority carriers in the base region, thereby reducing the base resistance and providing faster base transit times.

Since in the transistor of the invention fewer base impurity carriers are present in the collector region, the base-collector junction will be more abrupt and the transistor of the invention can accommodate higher current densities in the base region before prohibitive modification of the collector junction occurs.

Since the level at which the wafer will change from N to P type conductivity will be practically wholly dependent on the location of the boundary between epitaxial layers 18 and 20, the location of the base-collector junction can be fabricated very accurately and consistently and independent of the base diffusion gradient. This results in higher production yields and more predictable devices. Since the net impurity carrier concentration in the base region of the transistor of the invention is greater than in the prior art transistor, a stronger field will exist between the base region and the $N^+$ substrate 10 than the prior art transistor. This field lies in the proper direction to drive minority carriers (holes) which are injected from the base into the collector back to the base so that when the transistor is saturated, the carriers will not diffuse as deeply into the collector and thereby can be swept out more rapidly when the transistor is turned off. Hence the transistor of the invention has reduced storage time for recovery from a saturated condition, thereby making it more suitable for switching applications.

Accordingly it can be seen that the transistor of the invention will have greatly improved operating characteristics in relation to the prior art transistor. The technique of the invention permits the construction of transistors whose high frequency performance exceeds that of any transistor heretofore extant.

EXEMPLARY CONSTRUCTION

The following data is given as an example of one preferred embodiment of the invention. Onto a monocrystalline silicon substrate 10 which is doped to a substantially degenerate level, the N type layer 18 of medium resistivity (.07–0.7 ohm-cm.) is grown about .10 mil thick. On top of this layer a thinner (approx. .05 mil) substantially intrinsic layer 20 is grown and has as high a resistivity as possible (at least as high as 1 ohm-cm). Into region 20 is diffused the P type base region 14; this diffusion should extend at least as deep as the border between epitaxial layers 18 and 20 and should have a surface or sheet resistivity of about 600–1000 ohms/sq. Into the base region 14 the $N^+$ emitter region 16 is diffused to have a surface of sheet resistivity of about 3–10 ohms/sq.

While the invention has been discussed with reference to the fabrication of an NPN transistor, it will be understood that it is equally applicable to the fabrication of PNP transistor. The advantages of the invention will also be present in a diode structure, which can be formed according to the invention by omitting the emitter diffusion step.

While there has been described what it as present considered to be the preferred embodiment of the invention it will be apparent that various modifications and other embodiments thereof will occur to those skilled in the art within the scope of the invention. Accordingly, it is desired that the scope of the invention be limited by the appended claims only.

I claim:

1. In a transistor of the type comprising:

a monocrystalline body of semiconductive material having an upper surface, a substantially intrinsic layer extending from said upper surface to a boundary within said body which is substantially parallel to said upper surface, and a layer of a given conductivity type extending downwardly from said boundary, said layer of said given conductivity type constituting a collector region, said intrinsic layer containing a base region of conductivity type opposite said given type, which (a) extends downwardly from a portion of said upper surface and (b) has a lower surface which is substantially parallel to said upper surface and forms a rectifying junction with said collector region, said body also containing an emitter region of said given conductivity type which (a) extends downwardly from a part of said portion of said upper surface and (b) has a lower surface which is substantially parallel to said upper surface and forms a rectifying junction with said base region;

the improvement wherein said lower surface of said base region is substantially coincident with said boundary of said substantially intrinsic layer within said body and all portions of said collector region contain, per unit volume thereof, more impurity atoms of said given conductivity type than any portion of said base region.

2. In an epitaxial planar transistor of the type comprising:

a body of monocrystalline semiconductive material comprising a lower layer doped with impurity atoms to have a given conductivity type and resistivity, and having a planar upper boundary, said body having a second layer contiguous said planar upper boundary of said lower layer and having an upper planar surface and a lower planar boundary adjoining said upper planar boundary of said lower layer, said upper layer being substantially intrinsic and having a substantially higher resistivity than said lower layer, an emitter region of said given conductivity type extending from a first portion of said upper planar surface to a first depth in said upper layer, and a base region of the opposite conductivity type extending into said body from a second portion of said upper planar surface which surrounds said first portion thereof, said base region being contiguous to and extending completely under said emitter region so as to isolate said emitter region completely from the rest of said body and form a rectifying junction therewith, the improvement wherein (a) all portions of said base region contain, per unit volume thereof, fewer impurity atoms of said given conductivity type than any portion of said lower layer, and (b) said base region forms a rectifying junction with said lower layer which is substantially coplanar with said upper surface of said lower layer, such that the entire portion of said lower layer under said base region constitutes a collector region.

References Cited

UNITED STATES PATENTS

| | | | |
|---|---|---|---|
| 3,299,329 | 1/1967 | Pollock | 317—235 |
| 3,312,881 | 4/1967 | Yu | 317—235 |
| 3,271,201 | 9/1966 | Pomerantz | 148—33.3 |
| 3,370,995 | 2/1968 | Lowery et al. | 148—175 |
| 3,398,335 | 8/1968 | Dill | 317—235 |

FOREIGN PATENTS

| | | |
|---|---|---|
| 1,007,936 | 10/1965 | Great Britain. |

JERRY D. CRAIG, Primary Examiner

U.S. Cl. X.R.

148—175